United States Patent
Gaynes et al.

(10) Patent No.: US 7,504,718 B2
(45) Date of Patent: Mar. 17, 2009

(54) APPARATUS AND METHODS FOR CONSTRUCTING BALANCED CHIP PACKAGES TO REDUCE THERMALLY INDUCED MECHANICAL STRAIN

(75) Inventors: Michael Anthony Gaynes, Vestal, NY (US); Kathleen Conlon Hinge, Tarrytown, NY (US); John Ulrich Knickerbocker, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 11/125,499

(22) Filed: May 10, 2005

(65) Prior Publication Data

US 2006/0255442 A1    Nov. 16, 2006

(51) Int. Cl.
*H01L 23/02* (2006.01)
*H01L 29/40* (2006.01)

(52) U.S. Cl. .............. 257/686; 257/777; 257/778; 257/E23.194; 438/109

(58) Field of Classification Search ......... 257/777–778, 257/678, 686, 723, E23.123, E23.135, E23.194, 257/633, 727
See application file for complete search history.

(56) References Cited

U.S. PATENT DOCUMENTS

| | | | | |
|---|---|---|---|---|
| 5,838,063 A * | 11/1998 | Sylvester | ............... | 257/704 |
| 5,907,474 A * | 5/1999 | Dolbear | ............... | 361/705 |
| 5,977,622 A * | 11/1999 | Mertol | ............... | 257/687 |
| 6,337,509 B2 * | 1/2002 | Cokely et al. | ............ | 257/666 |
| 6,392,887 B1 * | 5/2002 | Day et al. | ............... | 361/704 |
| 6,488,806 B2 * | 12/2002 | Carden et al. | ............ | 156/311 |
| 6,490,161 B1 * | 12/2002 | Johnson | ............... | 361/704 |
| 6,639,321 B1 * | 10/2003 | Nagarajan et al. | ........... | 257/778 |
| 6,750,551 B1 * | 6/2004 | Frutschy et al. | ............ | 257/785 |
| 6,979,894 B1 * | 12/2005 | Sutardja | ............... | 257/686 |
| 6,989,894 B2 * | 1/2006 | Kitabayashi et al. | ..... | 356/124.5 |
| 2003/0094692 A1 * | 5/2003 | Ho et al. | ............... | 257/718 |
| 2005/0001311 A1 * | 1/2005 | Ho et al. | ............... | 257/712 |
| 2005/0109534 A1 * | 5/2005 | Chengalva et al. | ......... | 174/256 |
| 2005/0230841 A1 * | 10/2005 | Walk et al. | ............... | 257/778 |

* cited by examiner

*Primary Examiner*—Theresa T Doan
*Assistant Examiner*—Sarah K Salerno
(74) *Attorney, Agent, or Firm*—Robert M. Trapp; F. Chau & Associates, LLC

(57) ABSTRACT

Apparatus and methods are provided for constructing balanced semiconductor chip package structures that minimize bowing, in-plane strain and/or other thermally induced mechanical strains that may arise during thermal cycling, to thus prevent structural damage to chip package structures.

16 Claims, 3 Drawing Sheets

APPARATUS AND METHODS FOR CONSTRUCTING BALANCED CHIP PACKAGES TO REDUCE THERMALLY INDUCED MECHANICAL STRAIN

FEDERALLY SPONSORED RESEARCH AND DEVELOPMENT

This invention was made with Government support under Contract No. MDA972-03-3-0004 awarded by Defense Advanced Research Projects Agency. The Government has certain rights in this invention.

TECHNICAL FIELD OF THE INVENTION

The present invention relates generally to microelectronic packaging of semiconductor chips and, more specifically, apparatus and methods for constructing balanced semiconductor chip package structures that minimize or prevent bowing, in-plain expansion and/or other thermally induced mechanical strains that can cause structural damage to chip package structures.

BACKGROUND

Advances in semiconductor chip fabrication and packaging technologies has enabled development of highly integrated semiconductor chip devices and compact chip package structures (or electronic modules). As chip geometries are scaled down and operating speeds are increased and chip packages become more compact, however, power densities are increased resulting in more heat generation per unit area. Indeed, heat is primarily generated from wiring resistance and active device switching. The ability to implement electronic modules with increased chip densities and system performance is limited primarily by the ability to effectively remove heat from such electronic modules as resulting increased heat densities makes packaging more problematic. Indeed, substantial stresses and strains may be generated in a package structure caused by thermal cycling during chip operation, leading to device failure and structural defects.

More specifically, by way of example, an electronic module may comprise one or more semiconductor chips that are electrically and mechanically coupled to a substrate (or chip carrier) by soldering conductive contacts on the chip (e.g., C4 (Controlled Collapse Chip Connection) solder balls) to the top surface of the substrate. Moreover, an electronic module may comprise two or more levels of substrates that enable different levels of space transformation of an electrical interface to the chips. When the chips and substrates are formed from different materials having different coefficients of thermal expansion (CTE), the chip and substrate tend to expand and contract by different amounts during thermal cycling, which is a phenomenon known as "CTE mismatch". The CTE represents the ratio of change in dimensions to original dimensions per degree rise in temperature, expressed in ppm/° C. CTE mismatch denotes the difference in the coefficients of thermal expansions of two materials or components joined together, which produces strains and stresses at joining interfaces or in attachment surfaces.

During thermal cycling, relative displacement between components due to differences in CTE between such components can cause bowing or bending of substrates and generate significant stresses and strains in the electrical contacts and interface between the components. For instance, relative displacement between a chip and a carrier substrate and/or between two substrates (e.g., carrier and printed wiring board (PWB) or printed circuit board PCB) due to thermal cycling can deform the electrical interconnections between the components. These stresses are applied repeatedly with repeated operation of the device, and can cause fatigue of the electrical interconnections, especially C4s.

FIG. 1 is a schematic side-view of a conventional chip package (100). The package (100) comprises a semiconductor IC chip (101) mounted on a carrier substrate (102). The IC chip (101) is shown flip-chip bonded to bond sites on the carrier substrate (102) using an array of fine pitch solder balls (103) such as micro C4 (Controlled Collapsed Chip Connect) solder balls, which provide electrical connections between I/O pads on the active surface of the chip (101) and a footprint of corresponding pads on the surface of the chip carrier (102). The chip (101) may be formed on silicon and the carrier substrate (102) formed of ceramic or silicon. The interconnect between chip (101) and carrier substrate (102) may be strengthened with the addition of an underfill.

The chip carrier substrate (102) is electrically coupled to an organic substrate (104) using an array of larger pitch solder balls (105) (e.g., C4s), which provide electrical connections between I/O pads on the bottom surface of the chip carrier substrate (102) and a footprint of corresponding pads on the surface of the organic substrate (104). In FIG. 1, the organic substrate (104) may comprise a PCB or PWB having other chips and electronic components mounted thereon, or it may be an organic carrier that may ultimately be mounted to a PWB. The chip carrier substrate (102) comprises electrical wiring patterns on the surfaces thereof which are connected by electrical through via contacts to thereby provide a space transformation of the electrical interface between the I/O pads on the chip (101) to the organic substrate (104).

Moreover, chip carrier substrate (102) is mechanically coupled to the organic substrate (104) using an underfill material (106) disposed between the chip carrier (102) and the organic substrate (104). The underfill material (106) (e.g., epoxy) is flowed into the interface between the chip carrier (102) and substrate (104) after formation of connections (105) and then cured to form a rigid material. The underfill material (106) acts to redistribute mechanical stresses in the interface between the carrier (102) and substrate (104) caused by relative displacement between the chip carrier (102) and organic substrate (104) due to CTE mismatch, to thereby minimize stress applied to the C4 connections (105). Underfilling ensures minimum load on the interconnects and becomes the primary load bearing member between the chip carrier (102) and the substrate (104) during thermal or power cycling. Thermoset type materials are commonly used in the industry as underfill material.

With the exemplary package structure (100) of FIG. 1, CTE mismatches between the chip (101), chip carrier (102) and organic substrate (104) can cause various types of defects over time as a result of thermal cycling, e.g., during temperature excursions, such as cool-down from underfill cure temperatures (150 C and higher) or normal power-on/off cycles. The most common defects include delaminations, fractures or severed electrical connections, and the probability that such defects will occur increases as the size of the package increases. FIG. 1 depicts a dotted line representing a "neutral stress point", NSP, which is assumed to at the center of the chip package (100). The relative displacement due to the differences in thermal expansion between the chip (101), carrier substrate (102) and substrate (104) will be very small at the NSP, but will increase in accordance with the distance D (in all directions) from the NPS.

In the package structure of FIG. 1, when the chip and chip carrier are made of the same or similar materials such as silicon/silicon (Si CTE=2.8 ppm/C) or silicon/ceramic (ceramic CTE=~9 ppm/C chip), there may be little stress in the interface between the chip (101) and the carrier (102) due to in-plane expansion. However, a significantly greater CTE mismatch between the chip carrier (102) and the organic substrate (104) (laminate CTE=12-18 ppm/C) and the high Young's modulus (>1 Mpsi) of the underfill (106) can combine to cause bending in the chip-laminate structure as well as large in-plane expansion of the carrier substrate (102) relative to the substrate (104).

Although the underfill material (106) compensates for the CTE mismatch between the chip carrier (102) and the substrate (104) and minimizes stress on the C4 connections (105), the underfill material (106) must be relatively rigid to bear much of the load. As a result the chip carrier (102) and substrate (104) are strongly coupled such that differential thermal expansion causes substantial bending or flexing upward or downward of the organic substrate (104) and chip carrier (102). In extreme cases, the bending can cause cracking of the chip carrier (102) or substrate, and delamination and contact damage in the interface between the chip carrier (102) and organic substrate (104). In addition, the bending of the chip carrier (102) can cause undue stresses and strains between the chip carrier (102) and chip (101) leading to defects and structural damage, etc.

In other conventional methods, a uniform stiffener can be attached to the organic substrate, where the CTE of the stiffener is chosen to match that of the substrate in order to eliminate bending. In particular, FIG. 2 is a schematic side-view illustration of another conventional package structure (200). The package (200) is similar to the package (100) discussed above, except that a high-CTE stiffener substrate (201) is attached to the bottom surface of the organic substrate (104). The stiffener substrate (201) significantly reduces the bending of the package structure (200) (as compared to the package structure (100) of FIG. 1), but does not offset (in fact, it enforces) a large in-plane expansion between the organic substrate (104) relative to the chip carrier (102). Consequently, excessive shear stresses can be applied to the C4s connections (105) between the chip carrier (102) and the organic substrate (104), as well as some local bending near the outer peripheral regions of the chip carrier (102).

SUMMARY OF THE INVENTION

Exemplary embodiments of the invention generally include apparatus and methods for constructing balanced semiconductor chip package structures that minimize bowing, in-plain strain and/or other thermally induced mechanical strains that may arise during thermal cycling, to thus prevent structural damage to chip package structures.

In one exemplary embodiment of the invention, an electronic package apparatus includes a first substrate having first and second surfaces, an IC (integrated circuit) chip mounted to the first surface of the first substrate and a second substrate having first and second surfaces, wherein the second surface of the first substrate is mounted to the first surface of the second substrate. The package further comprises a first stiffener plate having first and second surfaces, wherein the first stiffener plate has an aperture region formed between the first and second surfaces of the first stiffener plate, and wherein the first stiffener plate is bonded to the second substrate such that the first substrate is aligned with the aperture region, and a second stiffener plate bonded to the second surface of the second substrate such that the second stiffener plate is aligned to the first substrate and the aperture region.

In one exemplary embodiment, the first stiffener plate is formed with a material and dimensioned to provide mechanical stability and planarity to the second substrate. The second stiffener plate is formed with a material and dimensioned to provide a mechanically balanced stacked structure above and below the region of the second substrate in the footprint areas where the IC chip to first carrier substrate assembly is attached to the second substrate.

For instance, in one exemplary embodiment of the invention, the first substrate and second stiffener plate are formed of silicon and the second substrate is an organic substrate (e.g., PCB, PWB). The package structure provides a balanced structure such that the organic substrate is in a neutral plane (i.e., there is no local bending in the organic substrate or in a SOP structure (Si chip on silicon carrier), and such that the in-plane expansion of the organic substrate is constrained so as to reduce shear strain in the interface between the organic substrate and chip carrier. For instance, a balanced structure can be obtained by selecting the material and dimensions of the second stiffener plate such that the second stiffener plate is formed of a material having a CTE similar to the chip carrier substrate and such that the second stiffener plate has a thickness that is matched to the effective stiffness of the SOP structure.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1:
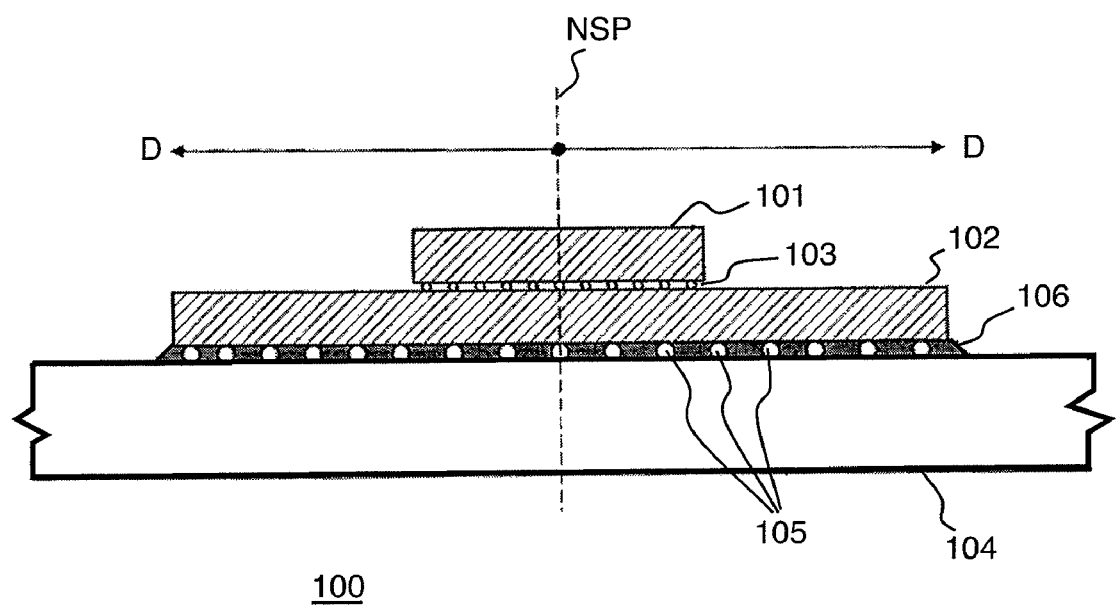
FIG. 1 is a schematic side-view of a conventional chip package structure.
Figure 3A:
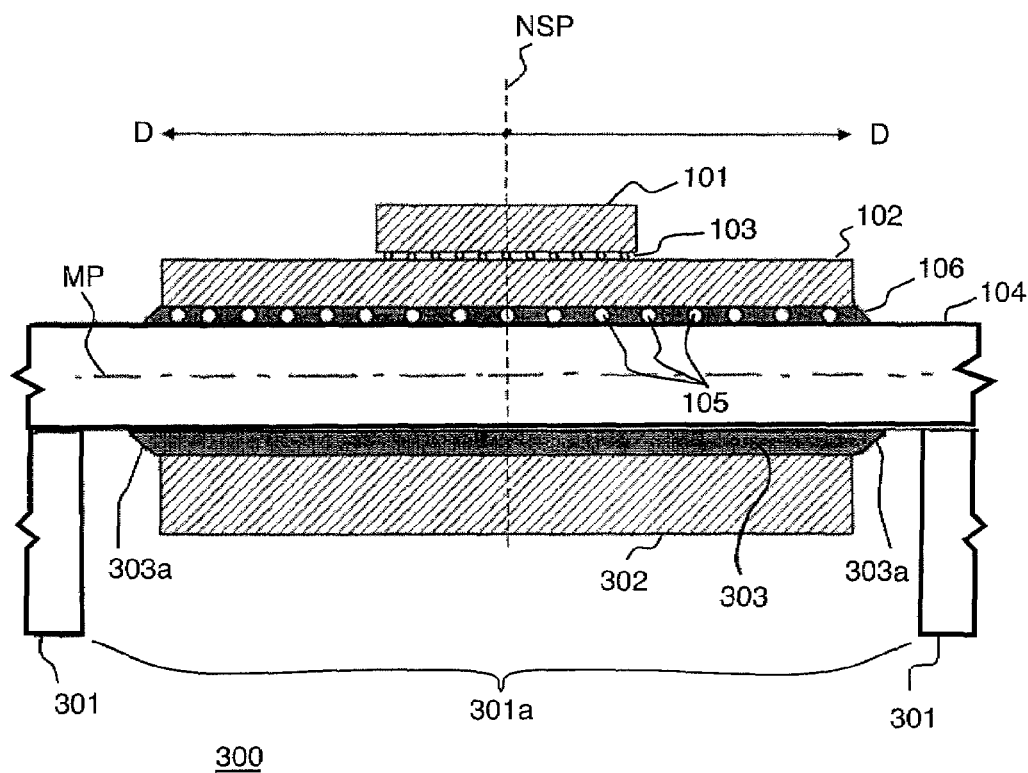
FIGS. 3A-3B are schematic side-views of a chip package structure according to exemplary embodiments of the invention.
Figure 3B:
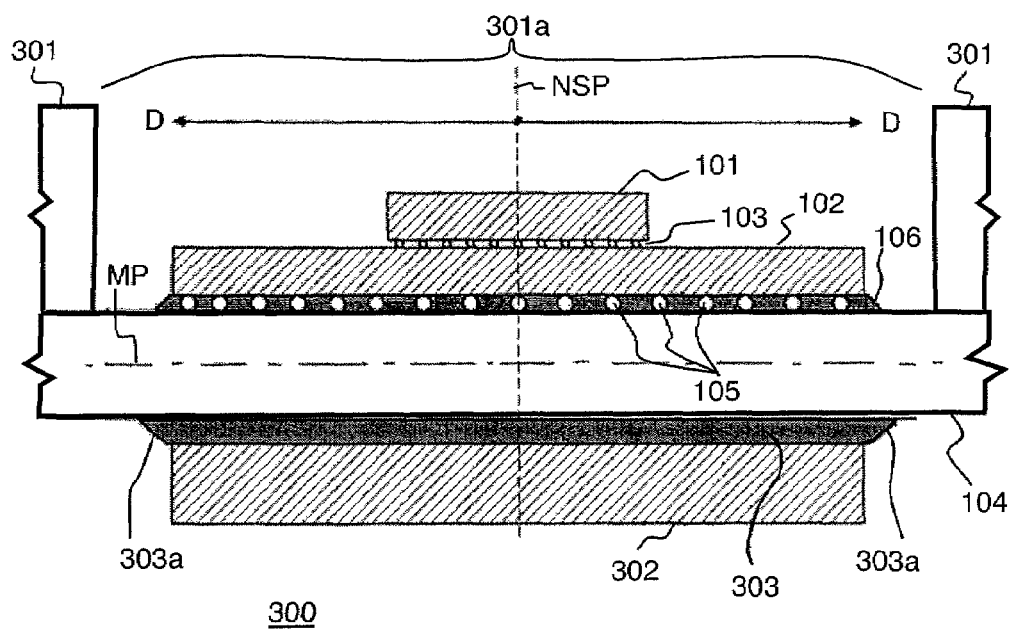

FIGS. 3A-3B are schematic side-view illustrations of a package structure according to exemplary embodiments of the invention. In general, FIGS. 3A-3B illustrate a package structure (300) comprising a semiconductor IC chip (101), a carrier substrate (102), C4 connections (103), an organic substrate (104), C4 connections (105), and underfill material (106), similar to that discussed above with reference to FIG. 1. In the following discussion, the structure comprising chip (101), connections (103) and chip carrier substrate (102) is referred to as a system-on-package structure (SOP) (110).

Figure 2:
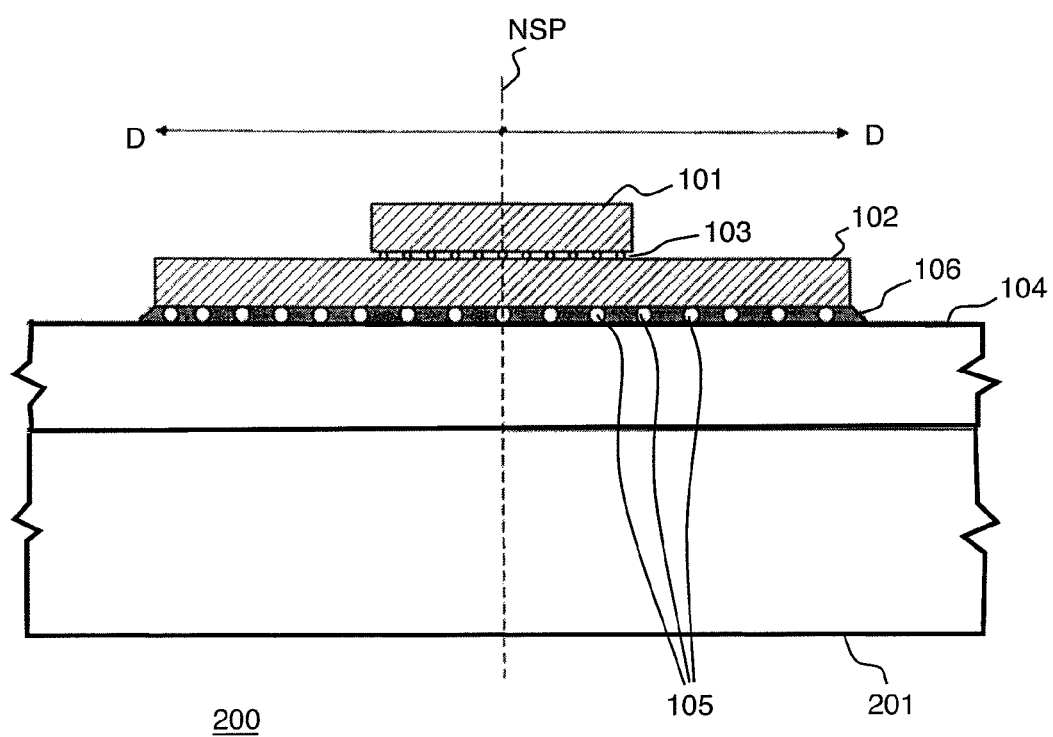
FIG. 2 is a schematic side-view of another conventional chip package structure.

In addition, the exemplary package structure (300) comprises a first stiffener plate (301) bonded to a surface of the organic substrate (104). In contrast to the package structure of FIG. 2, the first stiffener plate (301) comprises a cutout region (301a) (or aperture region). Moreover, the package structure (300) comprises a second stiffener plate (302) that is bonded to the organic substrate (104) using an adhesive material (303). As depicted in FIG. 3A, the SOP structure (110) and second stiffener plate (302) are mounted in alignment to each other on opposing surfaces of the organic substrate (104). Moreover, the first stiffener plate (301) is mounted to the organic substrate (104) such that the aperture region (301a) is aligned to the SOP structure (110) and the second stiffener plate (302).

In the exemplary embodiment of FIG. 3A, although the first and second stiffener plates (301) and (302) are shown being bonded to the same surface of the organic substrate (104) wherein the second stiffener plate (302) is disposed within the aperture region (301a), the package (300) may be constructed with the first stiffener plate (301) and SOP structure (110) bonded to the same surface of the organic substrate (104) wherein the SOP structure (110) is disposed within the aperture region (301a) as shown in FIG. 3B. Moreover, although only one SOP structure (110) is depicted, multiple SOP structures can be bonded to other regions of the organic substrate (104) in which case the first stiffener plate (301) would have a plurality of aperture regions aligned to corresponding SOP footprint regions.

In general, the exemplary package structure (300) provides a balanced package structure in which the various components are formed with materials and dimensions to minimize or eliminate bowing or flexing of the package substrates and shear stresses in the interfaces between the chip (101) and substrate (102) and between the chip carrier (102) and organic substrate (104).

As will be explained below, the package structure (300) provided a balanced structure such that the organic substrate (104) is in a neutral plane (i.e., there is no local bending in the organic substrate (104) or in the SOP structure (110)), and such that the in-plane expansion of the organic substrate (104) is constrained so as to reduce shear strain in the interface between the organic substrate (104) and chip carrier (102), to thereby reduce strain on the C4 connections (105). For instance, as will be explained below, a balanced structure can be obtained by selecting an adhesive material (303) to have properties (Young's modulus, CTE and Tg) that are similar to the underfill material (106) between the SOP (110) and the organic substrate (104), and by selecting the material and dimensions of the second stiffener plate (302) such that the second stiffener plate (302) is formed of a material having a CTE similar to the chip carrier substrate (102) and such that the second stiffener plate (302) has a thickness that is matched to the effective stiffness of the SOP structure (110).

The exemplary package structure (300) provides a balanced structure that: (i) minimizes that the overall (global) bending of the package structure (300); (ii) minimizes local bending along the region of the SOP structure (110); and that (iii) minimizes in-plane expansion of the organic substrate (104) relative to the chip carrier (102).

More specifically, in one exemplary embodiment of the invention, the first stiffener plate (301) is attached to the organic substrate (104) as a means for reducing the overall global bending of the package substrates. In general, the thickness and modulus of the first stiffener plate (301) are chosen to provide a required stiffness. For example, the bending can be eliminated by matching the CTE of the first stiffener plate (301) to the CTE of the organic substrate (104). In certain application where some degree of bending is tolerable, the first stiffener plate (301) can be formed of a material that has a CTE which is between the CTE of the organic substrate and the CTE of the chip carrier substrate (102). This helps to straddle the CTE mismatch between the organic substrate (104) and the chip carrier (102), thus helping minimize the local bending along the region of the SOP (110), as well as the in-plane expansion of the organic substrate (104) relative to the chip carrier substrate (102).

Furthermore, second stiffener plate (302) attached to the surface of the organic substrate (104) opposite, and aligned to, the SOP structure provides a means for minimizing the local bending along the region of the SOP (110). In one exemplary embodiment, the material and thickness of the second stiffener plate (302) is selected so that the "neutral axis" of the stacked structure (which includes the second stiffener plate (302), the organic substrate (104), and the SOP (110)) falls along or near the mid-plane, MP, of the organic substrate (104) (as depicted in FIG. 3A). Designing the package structure (300) to have a neutral axis that extends along or near the midplane, MP, of the organic substrate (104) provides a balanced design where the stiffness of the structure is balanced to reduce or eliminate local bending in the SOP footprint region of package structure (300).

Moreover, the second stiffener plate (302) provides a means for minimizing or preventing in-plane expansion of the organic substrate (104) relative to the chip carrier (102). In one exemplary embodiment, the materials of the chip carrier substrate (102) and second stiffener plate (302) are chosen to have the same or similar CTE. For instance, in one exemplary embodiment, the carrier substrate (102) and second stiffener plate (302) are formed of silicon. By sandwiching the organic substrate (104) between the chip carrier substrate (102) and second stiffener plate (302) having the same or similar CTEs constrains the in-plane strains in the interface between the chip carrier substrate (102) and organic substrate (104).

In another exemplary embodiment, the adhesive (303) which bonds the second stiffener plate (302) to the organic substrate (104) is formed of any suitable material having material properties that are matched to the material properties of underfill (106). Moreover, the adhesive (303) is selected to have a modulus that is sufficiently high to allow the second stiffener plate (302) to be sufficiently coupled to the organic substrate (104).

In one exemplary embodiment of the invention, the package structure (300) can be constructed based on the following materials and parameters. The first stiffener plate (301) can be formed using a metallic material such as 430 stainless steel (E=200 GPa, CTE=11 ppm/C) having a thickness of 4 mm. The organic substrate (104) is formed with a material with properties of E=1.2 GPa and CTE=18 ppm/C. With this exemplary embodiment, the CTE of the first stiffener plate (301) is chosen to be lower than the CTE of the organic substrate (104), but greater than the CTE of the silicon-based SOP structure (110), which reduces some of the global bending induced between the substrate (104) and the SOP (110).

The second stiffener plate (302) and chip carrier (102) are formed of silicon and the second stiffener plate (302) is formed to have planar dimensions (length and width) which are the same or substantially the same as the planar dimensions of the chip carrier substrate (102). AS noted above, the second stiffener plate (302) and chip carrier (102) are mounted in alignment on opposing surfaces of the organic substrate (104).

Moreover, in another exemplary embodiment, the aperture region (301a) is dimensioned to have a width and length that are about 1 mm to about 3 mm larger than the planar dimensions of the substrates (102), (104) aligned thereto. The organic substrate (104) in the region between the SOP (110) and the second stiffener plate (302) is in a neutral response zone to bending. Thus, the C4 interconnects (103) and underfill between the chip (101) and chip carrier (102) are not stressed even if the organic substrate (104) bends outside this balanced, "neutral zone".

The formation of a monolithic structure around the portion of the organic substrate (104) between the SOP (110) and the second (Si) stiffener plate (302) creates such neutral zone. A balanced structure is achieved by selecting materials of the underfill (106) between the SOP and the substrate (104) and the adhesive (303) which bonds the second stiffener plate (302) to the substrate (104) that have similar cured properties.

Moreover, in the space (e.g., 0.5 mm) between the ends of the second stiffener plate (302) and the first stiffener plate (301), the bonding adhesive (303) preferably forms a climbing fillet (303*a*) to the vertical rise of both the second stiffener (302) and the 430 SS stiffener (301). The fillet (303*a*) is a smooth, concave junction where the two surfaces meet. The quality of a fillet determines the strength of the bonding joint.

Moreover, other preferable material properties of the bonding adhesive (303) provide resistance to delamination (interfacial fracture toughness >100 J/m2), crack initiation and crack propagation (bulk fracture toughness >1 MPa $m^{0.5}$). Stress concentrations that may develop in the space between the first stiffener plate (301) and the second stiffener plate (302) are managed via the bonding adhesive fillet (303*a*), whereby the organic substrate (104) is protected from these stress concentrations.

Although exemplary embodiments of the invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

We claim:

1. An electronic apparatus, comprising:
   a first substrate having first and second surfaces and an IC (integrated circuit) chip mounted to the first surface of the first substrate;
   a second substrate having first and second surfaces, wherein the second surface of the first substrate is mounted to the first surface of the second substrate;
   a first stiffener plate having first and second surfaces, wherein the first stiffener plate has an aperture region formed between the first and second surfaces of the first stiffener plate, and wherein the first stiffener plate is bonded to the second substrate such that the first substrate is aligned with the aperture region; and
   a second stiffener plate bonded to the second surface of the second substrate such that the second stiffener plate is aligned to the first substrate and the aperture region,
   wherein the first and second substrates are package substrates and
   wherein the first and second stiffener plates are bonded to the second surface of the second substrate with the second stiffener plate disposed in the aperture region of the first stiffener plate, further comprising underfill material disposed in an interface between the first and second substrates, and bonding material disposed between an interface between the second substrate and the second stiffener plate, wherein the underfill material and bonding material have the same or similar cured mechanical properties.

2. The electronic apparatus of claim 1,
   wherein the second stiffener plate is disposed entirely within the aperture region of the first stiffener plate.

3. The apparatus of claim 1, wherein the first substrate and second stiffener plate are formed of silicon and wherein the second substrate is an organic substrate.

4. The apparatus of claim 3, wherein the first substrate and second stiffener plates have substantially the same planar dimensions.

5. The apparatus of claim 1, wherein the first stiffener plate is formed with a material that has a CTE (coefficient of thermal expansion) which is between a CTE of the second substrate and a CTE of the first substrate.

6. The apparatus of claim 1, wherein the first stiffener plate is formed with a material that has a CTE (coefficient of thermal expansion) that is substantially the same as a CTE of the second substrate.

7. The apparatus of claim 1, wherein the first stiffener plate is formed with a material having a Young's modulus and a thickness which provides a stiffness that is greater than a stiffness of the second substrate.

8. The apparatus of claim 1, wherein the aperture region of the first stiffener plate defines an opening that has a length and width which are greater than a length and width of the first substrate, respectively, and a length and width of the second stiffener plate, respectively.

9. The apparatus of claim 1, wherein the second stiffener plate has a stiffness that matches a composite stiffness of a stacked structure comprising the IC chip and the first substrate.

10. The apparatus of claim 1, wherein the second stiffener plate is formed of a material that has a Young's modulus and thickness that provides a stiffness which matches a stiffness of a composite structure comprising the IC chip and first substrate.

11. The apparatus of claim 1, wherein a stacked structure comprising the IC chip, first substrate, second stiffener plate, and region of the second substrate disposed between the first substrate and second stiffener plate, form a balanced structure where a neutral axis of the stack structure lies along or near a mid-plane of the second substrate.

12. The apparatus of claim 1, wherein the second stiffener plate is formed of metal, ceramic, a semiconductor or a composite material.

13. The apparatus of claim 1, wherein the second stiffener plate is formed of a material that has a CTE that is substantially the same as a CTE of a material forming the first substrate.

14. The apparatus of claim 1, wherein the bonding material near a peripheral edge regions of the interface between the second substrate and second stiffener plate forms a fillet that covers a surface region of the second substrate surrounding the second stiffener plate.

15. The apparatus of claim 1, wherein the second substrate is a printed circuit board or a printed wiring board.

16. An electronic apparatus, comprising:
   a silicon carrier substrate having first and second surfaces;
   an IC (integrated circuit) chip flip-chip mounted to the first surface of the silicon carrier substrate;
   an organic substrate having first and second surfaces, wherein the second surface of the silicon carrier substrate is electrically and mechanically coupled to the first surface of the organic substrate;
   a first stiffener plate having first and second surfaces, wherein the first stiffener plate has an aperture region formed between the first and second surfaces of the first stiffener plate, and wherein the first stiffener plate is mounted to the organic substrate such that the silicon carrier substrate is aligned with the aperture region; and
   a second stiffener plate formed of silicon, which is bonded to the second surface of the organic substrate, wherein the second stiffener plate has planar dimensions that are substantially the same as the planar dimensions of the silicon carrier substrate and wherein the second stiffener plate and silicon carrier substrate are mounted on opposing surfaces of the organic substrate in alignment to each other,
   further comprising underfill material disposed in an interface between the silicon carrier substrate and the organic substrate, and bonding material disposed between an interface between the organic substrate and the second stiffener plate, wherein the underfill material and bonding material have the same or similar cured mechanical properties, wherein a stacked structure comprising the IC chip, the silicon carrier substrate, second stiffener plate, and region of the organic substrate disposed between the silicon carrier substrate and second stiffener plate, form a balanced structure where a neutral axis of the stack structure lies along or near a mid-plane of the organic substrate to prevent local bending along such region of the organic substrate during thermal cycling.

* * * * *